United States Patent [19]

Shinagawa et al.

[11] Patent Number: 5,543,723
[45] Date of Patent: Aug. 6, 1996

[54] APPARATUS FOR ELECTRO-OPTIC SAMPLING MEASURING OF ELECTRICAL SIGNALS IN INTEGRATED CIRCUITS WITH IMPROVED PROBE POSITIONING ACCURACY

[75] Inventors: Mitsuru Shinagawa; Tadao Nagatsuma, both of Kanagawa, Japan

[73] Assignee: Nippon Telegraph and Telephone Corporation, Tokyo, Japan

[21] Appl. No.: 103,198

[22] Filed: Sep. 24, 1993

Related U.S. Application Data

[62] Division of Ser. No. 852,661, Mar. 17, 1992, Pat. No. 5,274,325.

[30] Foreign Application Priority Data

Mar. 18, 1991 [JP] Japan .................................. 3-52439

[51] Int. Cl.⁶ .................................................. G01R 29/12
[52] U.S. Cl. ................................. 324/752; 324/96
[58] Field of Search .................... 324/158 R, 158 F, 324/96, 117 R, 662, 689, 244.1, 752, 753; 250/310, 311, 306, 307, 227; 356/400, 401

[56] References Cited

U.S. PATENT DOCUMENTS 4,851,767  7/1989  Halbout et al. .................. 324/158 R
4,864,227  9/1989  Sato .................................. 324/158 R
4,866,372  9/1989  Aoshima et al. ...................... 324/96
4,894,607  1/1990  Kumada .................................. 324/96
4,985,676  1/1991  Karasawa .......................... 324/158 R
5,065,103  11/1991 Slinkman et al. ...................... 324/662

Primary Examiner—Vinh P. Nguyen
Attorney, Agent, or Firm—Banner & Allegretti, Ltd.

[57] ABSTRACT

A method and an apparatus for electro-optic sampling measurement of electrical signals in integrated circuits, capable of improving the reproducibility of the measurements and calibrating the voltage accurately. The changes of beam intensity of a laser beam reflected from an electro-optic probe is measured by using a low frequency signal of a known voltage level to determine a relationship between the changes of beam intensity and gaps between the electro-optic probe and the integrated circuit, then a proportionality of the change of beam intensity and an absolute voltage level for a desired gap is determined according to the determined relationship. Then, the change of beam of intensity at a desired measurement position with a desired gap is measured by using a high frequency signal and the absolute voltage level of the high frequency signal is determined according to the measured change of beam intensity and the determined proportionality. The electro-optic probe is positioned by first bringing the electro-optic probe into a contact with the integrated circuit to detect a contact position, and then moving the electro-optic probe away from the integrated circuit to provide a desired gap with respect to the detected contact position regarded as a reference point.

16 Claims, 7 Drawing Sheets

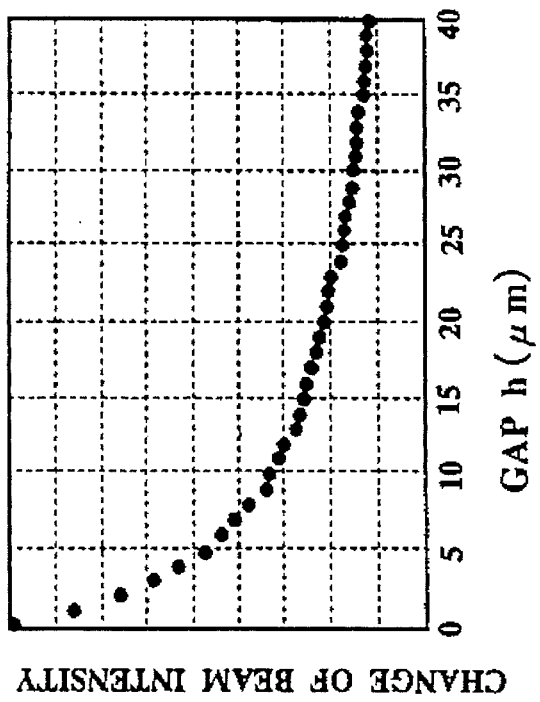
FIG.6
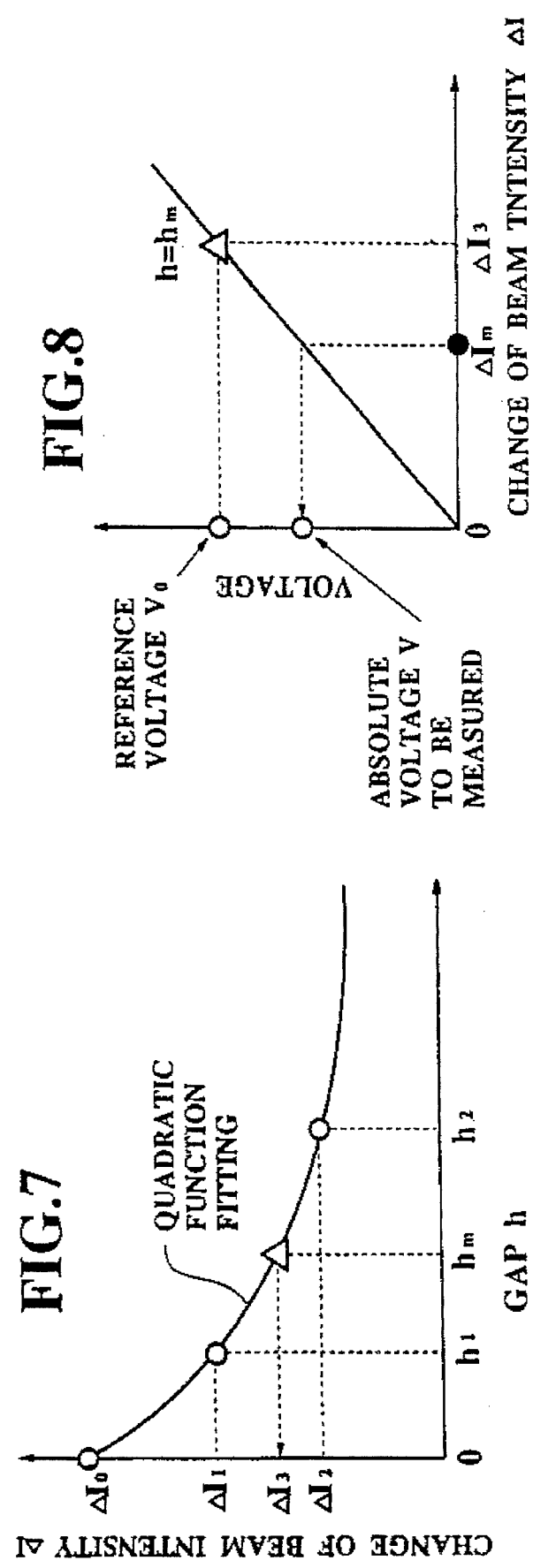
FIG.7
FIG.8

APPARATUS FOR ELECTRO-OPTIC SAMPLING MEASURING OF ELECTRICAL SIGNALS IN INTEGRATED CIRCUITS WITH IMPROVED PROBE POSITIONING ACCURACY This is a division of patent application Ser. No. 07/852,661 filed Mar. 17, 1992, now U.S. Pat. No. 5,274,325.

BACKGROUND OF THE INVENTION

1. Field of the Invention

The present invention relates to a method and an apparatus for measuring electrical signals in integrated circuits by utilizing the electro-optic effect and laser beams.

2. Description of the Background Art

When an electro-optic material which changes its index of refraction according to the surrounding electric field is placed inside the electric field produced by an operating integrated circuit while laser beams propagate through this electro-optic material, the polarization of the laser beams changes due to the change of the index of refraction of the electro-optic material. This change of the polarization of the laser beams can be converted into the change of the beam intensity by means of an optical system for polarization detection using a polarizer. Thus, by measuring the change of the beam intensity of the laser beams illuminating the electro-optic material, it is possible to measure the electric field coupled to the electro-optic material, i.e., the voltage signal at a point of measurement at which the electro-optic material is located. This method of measuring the voltage signal of the integrated circuit has been known as the electro-optic sampling.

In such an electro-optic sampling, the coupling of the electric field to the electro-optic probe using the electro-optic material varies in correspondence to a distance between the probe and the circuit under examination (referred hereafter as a gap), so that the detected change of the beam intensity strongly depends on the gap with which the measurement was made.

However, conventionally, there has been no established procedure for the positioning of the probe to determine the gap precisely, and the measurement has been made either by bringing the probe as close to the circuit under examination as the sufficient S/N ratio for making the measurement of the voltage signal can be realized, or by bringing the probe in contact with the circuit under examination.

For this reason, the reproducibility of the measurement has been poor because of the variation of the gaps used in different measurement trials, and while it has been possible to obtain the timing information such as a relative timing delay and rise time and fall time of the waveform, it has not been possible to obtain the information on the waveform amplitude and the absolute voltage which is particularly valuable in the measurement of the analog circuit for the purpose of facilitating the comparison of the waveforms.

SUMMARY OF THE INVENTION

It is therefore an object of the present invention to provide a method and an apparatus for electro-optic sampling measurement of electrical signals in integrated circuits, capable of improving the reproducibility of the measurements and calibrating the voltage amplitude of the waveform.

According to one aspect of the present invention there is provided a method of electro-optic sampling measurement of electrical signals in an integrated circuit, comprising the steps of: (a) measuring changes of beam intensity of a laser beam reflected from an electro-optic probe placed in an electric field produced from a conductor at a preliminary measurement position on the integrated circuit while a low frequency signal of a known voltage level is applied to the conductor; (b) determining a relationship between the changes of beam intensity measured at the step (a) and gaps between the electro-optic probe and the integrated circuit with which the changes of beam intensity are measured at the step (a), for said known voltage level; (c) determining a proportionality of the change of beam intensity and an absolute voltage level for a desired gap according to the relationship determined at the step (b); (d) measuring a change of beam intensity of a laser beam reflected from the electro-optic probe placed in an electric field produced at a desired measurement position on the integrated circuit with the desired gap between the electro-optic probe and the integrated circuit, while a high frequency signal of unknown voltage level is applied at the desired measurement position; and (e) determining the absolute voltage level of the high frequency signal at the desired measurement position according to the change of beam intensity measured at the step (d) and the proportionality determined at the step (c).

According to another aspect of the present invention there is provided an apparatus for electro-optic sampling measurement of electrical signals in an integrated circuit, comprising: an electro-optic probe including an electro-optic material; actuator means for moving the electro-optic probe and the integrated circuit relative to each other; laser source means for providing incident laser beams to the electro-optic probe; laser beam detection means for measuring a change of beam Intensity of a laser beam injected into the electro-optic probe from the laser source means and reflected from the electro-optic probe when the electro-optic probe is placed inside an electric field produced by the integrated circuit; and contact detection means for detecting a contact position at which the electro-optic probe makes a contact with the integrated circuit.

According to another aspect of the present invention there is provided a method for positioning an electro-optic probe in an electro-optic sampling measurement of electrical signals in an integrated circuit, comprising the steps of: bringing the electro-optic probe into a contact with the integrated circuit to detect a contact position at which the electro-optic probe makes the contact with the integrated circuit; and moving the electro-optic probe away from the integrated circuit to provide a desired gap with respect to the detected contact position regarded as a reference point.

According to another aspect of the present invention there is provided an apparatus for positioning an electro-optic probe in an electro-optic sampling measurement of electrical signals in an integrated circuit, comprising: contact detection means for detecting a contact position at which the electro-optic probe makes a contact with the integrated circuit; and actuator means for moving the electro-optic probe and the integrated circuit relative to each other, to bring the electro-optic probe into a contact with the integrated circuit and to move the electro-optic probe away from the integrated circuit to provide a desired gap with respect to the detected contact position regarded as a reference point.

Other features and advantages of the present invention will become apparent from the following description taken in conjunction with the accompanying drawings.

BRIEF DESCRIPTION OF THE DRAWINGS

FIG. 8 is a block diagram of the apparatus for electro-optic sampling measurement shown in FIG. 2, in a state in which the probe makes a contact with the circuit under examination.

FIG. 6 is a graph showing a relationship between the change of the beam intensity and the gap in the electro-optic sampling measurement.

FIG. 7 is an Illustration of the quadratic function fitting for the relationship between the change of the beam intensity and the gap in the electro-optic sampling measurement which is utilized In the method according to the present invention.

FIG. 8 is a graph showing a relationship between the change of the beam Intensity and the absolute voltage in the electro-optic sampling measurement which is utilized in the method according to the present invention.

DETAILED DESCRIPTION OF THE PREFERRED EMBODIMENTS

Figure 1:
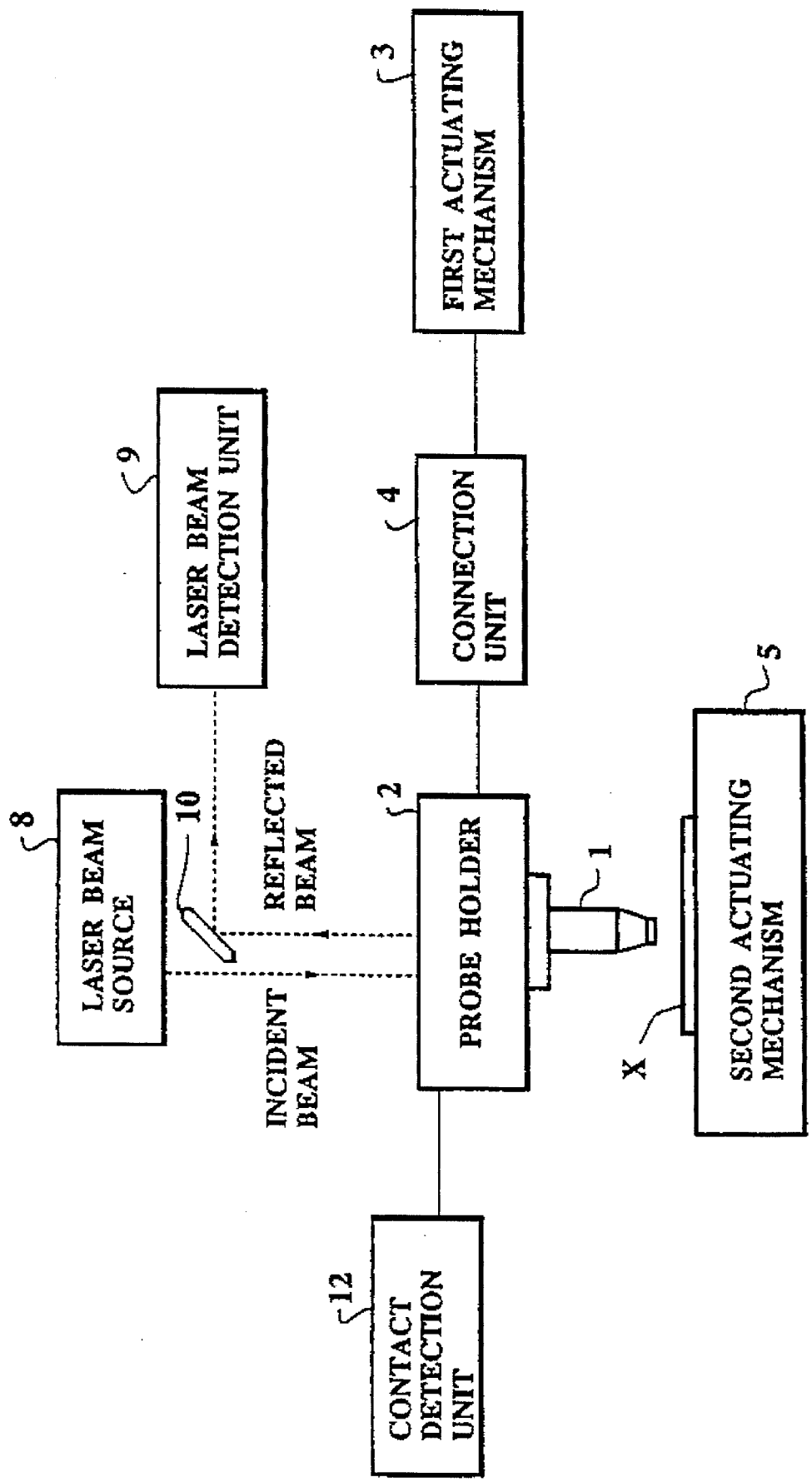
FIG. 1 is a schematic block diagram of a generic configuration of an apparatus for electro-optic sampling measurement of the electric signals in integrated circuits according to the present invention.

Referring now to FIG. 1, a generic configuration of an apparatus for electro-optic sampling measurement of electrical signals in integrated circuits according to the present invention will be described.

As shown in FIG. 1, according to the present invention, the apparatus for electro-optic sampling measurement generally comprises: a probe 1 for measuring the electric field in a circuit under examination X, in which an electro-optic material which changes its index of refraction according to the surrounding electric field is mounted at a bottom end of a transparent base material; a probe holder 2 for holding the probe 1; a first actuating mechanism 3 for actuating the probe holder 2 in up and down direction at high precision; a connection unit 4 provided between the probe holder 2 and the first actuating mechanism 3 which function to reduce the effective weight of the probe 1 in order to reduce a shock on the circuit under examination X when the probe 1 makes a contact with the circuit under examination X; a second actuating mechanism 5 for actuating the circuit under examination X placed thereon in up and down direction at high precision; a laser beam source 8 for providing incident laser beams to the electro-optic material of the probe 1; a laser beam detection unit 9 for detecting the reflected laser beams from the electro-optic material of the probe 1 through a mirror 10; and a contact detection unit 12 for detecting the contact of the probe 1 with the circuit under examination X.

In this configuration, each of the first and second actuating mechanisms 3 and 5 can be formed by a piezo-actuator, an electromagnetic coil, or a stepping motor, for example.

The connection unit 4 can be formed by a balance mechanism, spring, magnet, or air pressure mechanism.

The contact detection unit 12 detects the contact by detecting the displacement of the probe 1 or the probe holder 2 caused by the contact, and can be formed by an image processor, laser displacement meter, eddy current displacement sensor, electric contact sensor, or capacitance displacement sensor.

The laser beam source 8 is formed by a laser device capable of generating short pulse laser beams such as YAG laser, YLF laser, and semiconductor laser, where the selection is made according to the wavelength characteristics of the electro-optic material used in the probe 1 and the bandwidth of the electrical signals to be measured.

The laser beam detection unit 9 measures the change of the beam intensity of the reflected laser beam by converting the change of the polarization of the laser beams caused by the change of the index of refraction of the electro-optic material in the probe 1 into the change of the beam intensity by means of an optical system for polarization detection using a polarizer, so as to obtain the information on the electrical signals in the circuit under examination X.

The electro-optic material used in the probe 1 is designed for detecting the longitudinal electric field over the conductors in the circuit under examination X, and made from a crystal of any one of GaAs (gallium arsenide), KD.P (deuterated potassium di-hydrogen phosphate), ZnTe (zinc telluride), CdTe (cadmium telluride), or an organic optical material formed to have a sensitivity for the longitudinal electric field.

Now, in the method of electro-optic sampling measurement according to the present invention, the apparatus having a configuration shown in FIG. 1 is operated to perform a probe positioning procedure in which the probe 1 is brought into a contact with the circuit under examination X by means of the first and second actuating mechanisms 3 and 5 first, where a point of contact is detected by the contact detection unit 12, and then by using the detected point of contact as a reference point, the position of the probe 1 with respect to the circuit under examination X is appropriately adjusted by means of the first and second actuating mechanisms 3 and 5. This probe positioning procedure has an advantage of being capable of determining the position of the probe 1 at high precision because of the use of the detected point of contact as a reference point.

Here, the possible damage of the circuit under examination X due to the shock caused by the contact with the probe 1 is effectively eliminated by the function of the connection unit 4 to reduce the shock.

Moreover, in the method of electro-optic sampling measurement according to the present Invention, by utilizing the above described probe positioning procedure, it becomes possible to make the measurement of the absolute voltage by determining the relationship between the change of the beam intensity and the gap by using low frequency signals first, and then determining the absolute voltage of the high frequency signals measured at an arbitrary point in the circuit under examination X according to the determined relationship and the measured change of the beam intensity.

Further details of the method and apparatus for electro-optic sampling measurement according to the present invention will become obvious in the detailed description of more specific embodiments described below.

Figure 2:
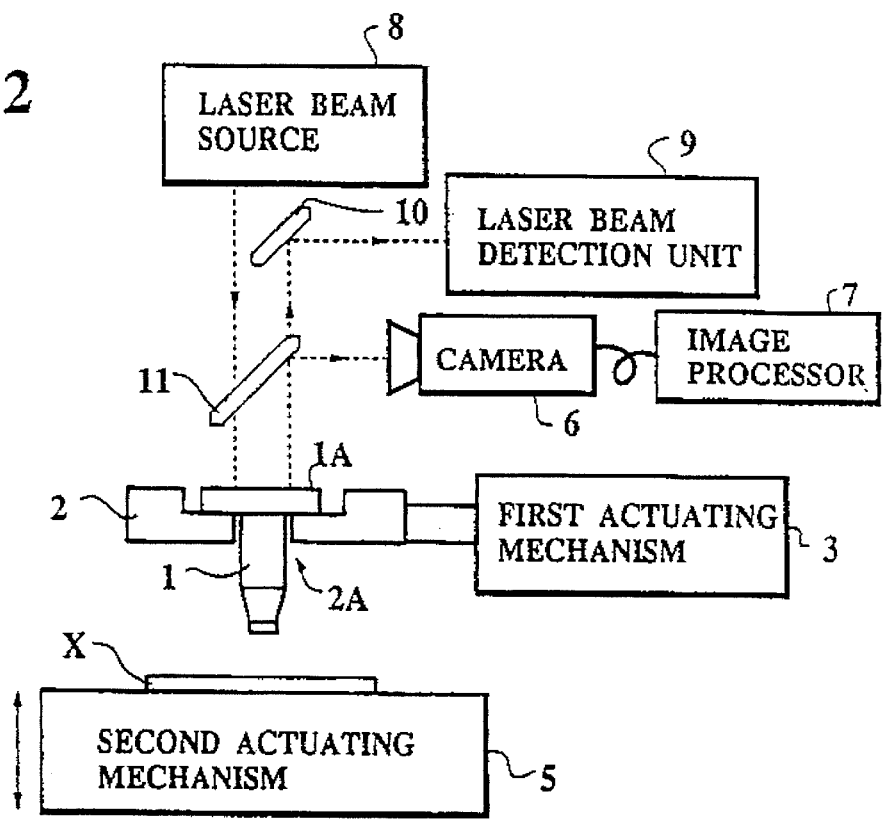
FIG. 2 is a block diagram of the first embodiment of an apparatus for electro-optic sampling measurement of the electric signals in integrated circuits according to the present invention.

Referring now to FIG. 2, the first embodiment of an apparatus for electro-optic sampling measurement of electrical signals in integrated circuits according to the present invention will be described in detail. This first embodiment is suitable for a case of using a very light weighted probe.

In this first embodiment, the apparatus comprises: the probe 1 for measuring the electric field in a circuit under examination X; the probe holder 2 for loosely holding the probe 1; the first actuating mechanism 3 for actuating the probe holder 2 in up and down direction at high precision; the second actuating mechanism 5 for actuating the circuit under examination X placed thereon in up and down direction at high precision; the laser beam source 8 for providing incident laser beams to the electro-optic material of the probe 1; the laser beam detection unit 9 for detecting the reflected laser beams from the electro-optic material of the probe 1 through a mirror 10; and a contact detection unit formed by a camera 6 for imaging the probe 1 by using the reflected laser beams obtained through a dichroic mirror 11, and an image processor 7 for detecting the point of contact by detecting the displacement of the probe 1 caused by the contact according to the images of the probe 1 imaged by the camera 6.

As can be seen In FIG. 2, in this first embodiment, the probe 1 is formed in a needle shape having the electro-optic material fixed at a bottom end (lower side In FIG. 1) of a transparent base material, and a flange portion 1A at a top end (upper side in FIG. 1).

Figure 3:
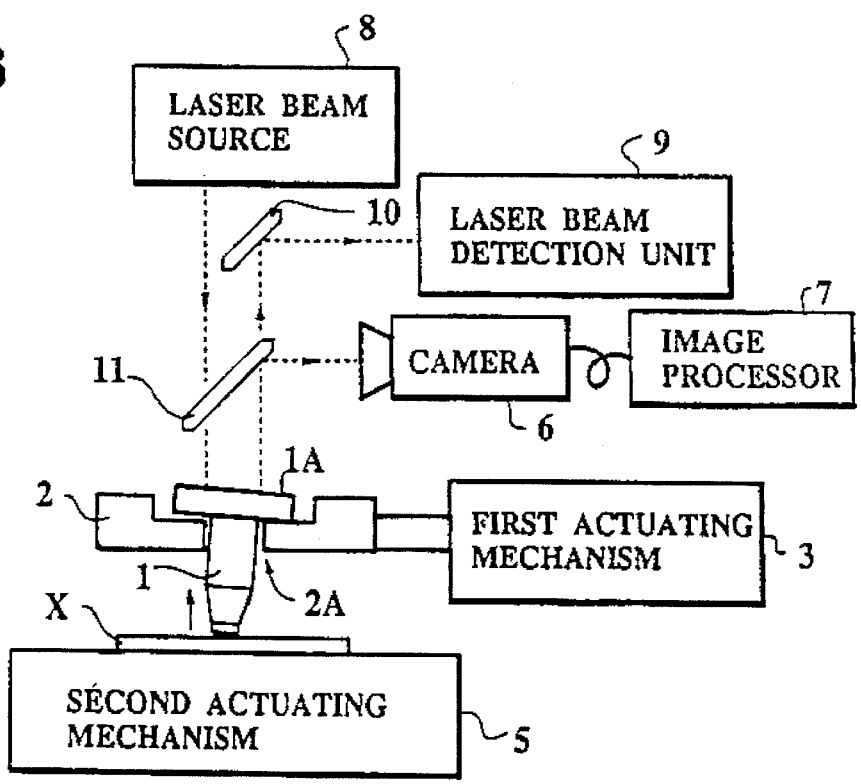

Also, as can be seen in FIG. 2, in this first embodiment, the probe holder 2 has a hole 2A into which the probe 1 is inserted, and supports the probe 1 at the flange portion 1A loosely, such that the probe 1 can freely be moved upwards when the probe 1 receives an upward force by making a contact with the circuit under examination X located below the probe 1 as shown in FIG. 3.

This configuration of the probe 1 and the probe holder 2 shown in FIG, 2 has the following advantages.

(1) A damage due to the contact of the probe 1 with the circuit under examination X can effectively be eliminated by using a very light weighted probe 1 with a weight in a range of 0.1 to 0.3 grams.

(2) The detection of the contact can be carried out at high precision because the displacement of the probe 1 is caused by even a slight contact of the probe 1 with the circuit under examination X.

(3) The displacement of the position of the probe 1 with respect to the probe holder 2 due to the shock caused by the contact is practically negligible because the point of contact can be detected at high precision, so that the reproducibility of the measurement can be maintained.

Now, the method of electro-optic sampling measurement according to the present invention using the apparatus of FIG. 2 will be described in detail.

In this electro-optic sampling measurement, the absolute voltage of the circuit under examination is measured by utilizing the following properties of the electro-optic sampling by the electro-optic material having a sensitivity for the longitudinal electric field over the conductor of the circuit under examination.

(1) The change of the beam intensity measured in a state in which the probe makes contact with the conductor is a constant regardless of the shape such as a width of the conductor, and is equivalent-to the measurement of the absolute voltage.

(2) The change of the beam intensity is strongly dependent on the gap between the probe and the circuit under examination, such that the change of the beam intensity monotonically decreases as the gap increases.

(3) When the gap between the probe and the circuit under examination is held constant, the change of the beam intensity and the absolute voltage is proportional.

More specifically, this method of electro-optic sampling measurement of the absolute voltage is carried out according to the following procedure.

Figure 4:
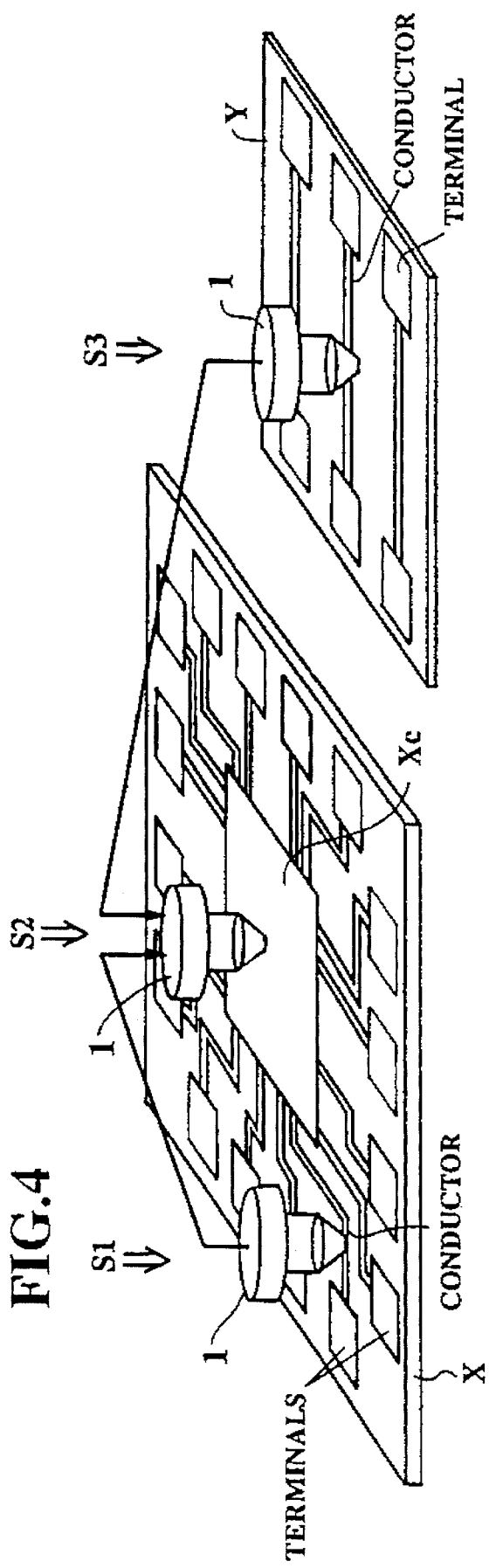
FIG. 4 is a perspective illustration of the probe and the circuit under examination for explaining the procedure in the method for electro-optic sampling measurement according to the present invention.

In the first stage of the procedure, in a situation S1 shown in FIG. 4 in which the probe 1 is located over the conductor connected to the input and output terminal or power supply terminal of the circuit under examination, the measurement of the change of the beam intensity is carried out by applying the low frequency signals to the terminal. This low frequency signal measurement is adopted for the following reasons.

(1) When the low frequency signals are used, the measurement can be made at an arbitrary point over the conductor because the amplitude of the low frequency signals applied to the terminal does not vary over the conductor connected to the terminal.

(2) The electro-optic material used in the probe 1 has a flat frequency characteristic over the range covering the low frequency signals used in this low frequency signal measurement and the high frequency signals appearing in the circuit in the operating state, so that the measurement result obtained by the low frequency signal measurement can be utilized In the high frequency signal measurement.

(3) The contact of the probe 1 with the conductor causes no problem in a case of the low frequency signals because of the absence of the heat generation from the conductor and the problem of the invasiveness due to the contact.

(4) The direct measurement of the externally supplied known signals can be made only on points over the conductor connected to the input and output terminal or power source terminal.

This low frequency signal measurement is carried out in detail as follows.

First, the probe 1 is brought into contact with the conductor connected to the input and output terminal or power source terminal of the circuit under examination X by placing and maintaining the probe 1 by the first actuating mechanism 3 over the conductor on which the measurement is to be made, and then moving the circuit under examination X upward gradually by the second actuating mechanism 5 until the displacement of the probe 1 caused by the contact of the probe 1 with the circuit under examination X as shown in FIG. 3 is detected by the image processor 7. The second actuating mechanism 5 is stopped as soon as the point of contact is detected by the image processor 7.

Figure 5:
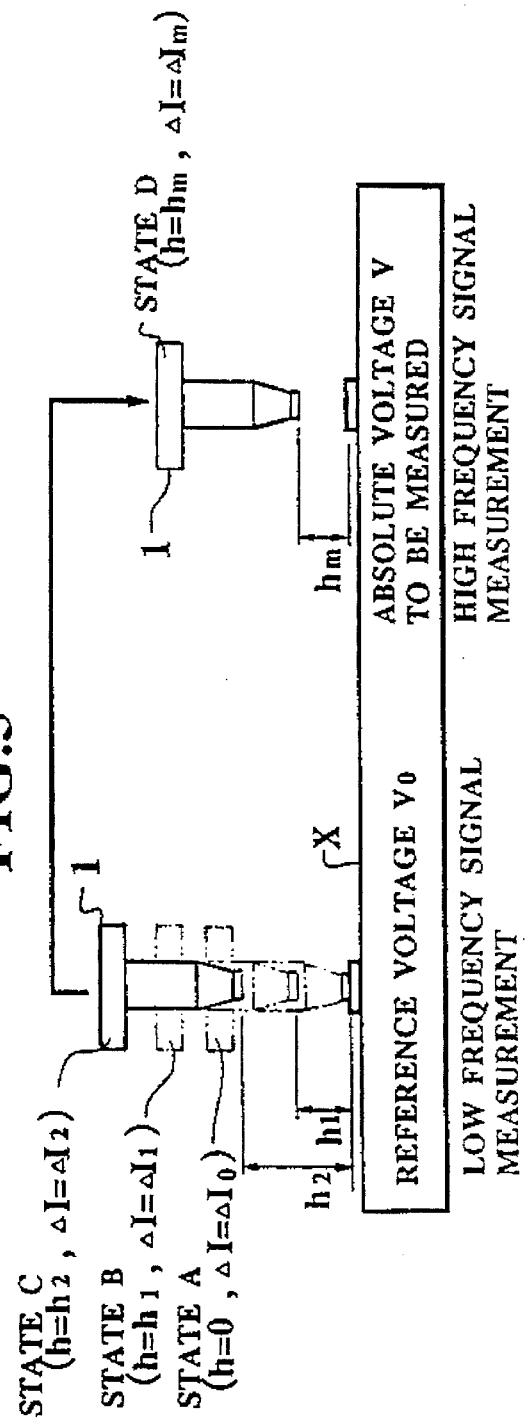
FIG. 5 is a side view illustration of the probe for explaining the positioning of the probe in the procedure in the method for electro-optic sampling measurement according to the present invention.

Then, without operating the circuit under examination X, the known low frequency signal of the reference voltage level $V_0$ is externally applied to the terminal to which the conductor in contact with the probe 1 is connected, while the laser beams illuminates the probe 1, so as to measure the change of the beam intensity $\Delta I_0$ corresponding to the reference voltage level $V_0$, as indicated by a state A shown in FIG. 5.

This change of the beam intensity $\Delta I_0$, corresponds to the absolute voltage of the conductor because the electro-optic material used in the probe 1 has the sensitivity for only the longitudinal electric field over the conductor.

Here, it is to be noted that the change of the beam intensity measured in a state in which the probe 1 makes contact with the conductor is a constant regardless of the shape such as a width of the conductor, so that this low frequency signal measurement may be made on a different conductor pattern on a separate chip Y as in a situation S3 shown in FIG. 4.

Next, at the same position, the circuit under examination X is sequentially lowered by the second actuating mechanism 5 to provide the predetermined gaps $h_1$ and $h_2$ with respect to the reference point provided by the detected point of contact, and the changes of the beam intensity $\Delta I_1$ and $\Delta I_2$ corresponding to the reference voltage level $V_0$ are measured for the gaps $h_1$ and $h_2$, respectively, as indicated by states B and C shown in FIG. 5, respectively.

Now, the change of the beam intensity monotonically decreases as shown in FIG. 6, so that it can be approximated by a simple function such as a quadratic function. Thus, by taking the data of the change of the beam intensity $\Delta I$ for several gaps h and making the quadratic function fitting to the data, it becomes possible to derive the change of the beam intensity corresponding to an arbitrary gap. Here, it is to be noted that, as can be seen in FIG. 6, the rate of the change of the beam intensity in a vicinity of h=0 is quite large in general so that it is difficult to estimate the value for h=0 from the measured value for h≠0, and any such estimation would suffer from a poor accuracy. On the other hand, when the value for h=0 is known, not so many data for h≠0 are required to obtain the good fitting, so that the measurement for h=0 is practically indispensable in order to secure the satisfactory accuracy for the fitting.

In the second stage of the procedure, in a situation S2 shown in FIG. 4 in which the probe 1 is located over a desired measurement position on the circuit portion $X_C$ of the circuit under examination X, the measurement of the change of the beam intensity is carried out for the circuit under examination X in a normal operation state with high frequency signals. Here, in this high frequency signal measurement, the probe 1 must be distanced from the circuit under examination X in order to avoid the thermal effect on the probe due to the circuit under examination X operated by high frequency signals and the effect of the invasiveness on the capacitive load of the circuit under examination X. For this reason, in this high frequency signal measurement, the appropriate gap $h_m$ prescribed according to the conditions such as sensitivity, invasiveness, and thermal effect is provided between the probe 1 and the circuit under examination X, as indicated by a state D shown in FIG. 5.

Then, by using the quadratic function fitting of FIG. 7 obtained from the low frequency signal measurement, the change of the beam intensity $\Delta I_3$ corresponding to the reference voltage level $V_0$ for the gap of $h_m$ is derived.

Next, because the change of the beam intensity $\Delta I$ is proportional to the absolute voltage of the circuit under examination for the fixed gap, the relationship between the change of the beam intensity $\Delta I$ and the voltage level V for the prescribed gap $h_m$ can be derived in a form of a straight line shown in FIG. 8 on a basis of the derived change of the beam intensity $\Delta I_3$ is corresponding to the reference voltage level $V_0$. Thus, from this relationship of FIG. 8, the absolute voltage corresponding to the change of the beam intensity measured at any desired measurement point can be determined.

Such a high frequency signal measurement at a desired measurement point can be carried out as follows.

First, the probe 1 is brought into contact with the circuit under examination X at the desired measurement point by placing and maintaining the probe 1 by the first actuating mechanism 3 over the desired measurement point on the circuit under examination X, and then moving the circuit under examination X upward gradually by the second actuating mechanism 5 until the displacement of the probe 1 caused by the contact of the probe 1 with the circuit under examination X as shown in FIG. 8 is detected by the image processor 7. The second actuating mechanism 5 is stopped as soon as the point of contact is detected by the image processor 7.

Then, at the same position, the circuit under examination X is lowered by the second actuating mechanism 5 for the prescribed gap $h_m$ with respect to the reference point provided by the detected point of contact, and the changes of the beam intensity $\Delta I_m$ is measured for the prescribed gap $h_m$, as indicated by a state D shown in FIG. 5, respectively.

Finally, the absolute voltage corresponding to the measured change of the beam intensity $\Delta I_m$ is determined according to the relationship of FIG. 8.

Thus, according to this first embodiment, it becomes possible to measure the absolute voltage at arbitrary measurement point on the circuit under examination with good reproducibility, without adverse effects due to the invasiveness and heat generation. As a result, it becomes possible to obtain the information on the waveform amplitude which is necessary in carrying out the waveform comparison, especially in the analog circuit.

It is to be noted that in the procedure for the electro-optic sampling measurement described above, the positioning of the probe 1 to provide the appropriate gap between the probe 1 and the circuit under examination X by moving the circuit under examination X by the second actuating mechanism 5 while fixing the probe 1 by the first actuating mechanism 3 may be replaced by any one of the following alternative procedures.

(1) The probe 1 can be brought into contact with the circuit under examination X by placing and maintaining the circuit under examination X by the second actuating mechanism 5 below the probe 1, and then moving the probe 1 downward gradually by the first actuating mechanism 3 until the displacement of the probe 1 caused by the contact of the probe 1 with the circuit under examination X as shown in FIG. 3 is detected by the image processor 7. The first actuating mechanism 3 is stopped as soon as the point of contact is detected by the image processor 7. Then, at the same position, the probe 1 is raised by the first actuating mechanism 3 for the desired gap with respect to the reference point provided by the detected point of contact.

(2) The probe 1 can be brought into contact with the circuit under examination X by placing and maintaining the probe 1 by the first actuating mechanism 3 over the circuit under examination X, and then moving the circuit under examination X upward gradually by the second actuating mechanism 5 until the displacement of the probe 1 caused by the contact of the probe 1 with the circuit under examination X as shown in FIG. 3 is detected by the image processor 7. The second actuating mechanism 5 is stopped as soon as the point of contact is detected by the image processor 7. Then, at the same position, the probe 1 is raised by the first actuating mechanism 3 for the desired gap with respect to the reference point provided by the detected point of contact.

(3) The probe 1 can be brought into contact with the circuit under examination X by placing and maintaining the circuit under examination X by the second actuating mechanism 5 below the probe 1, and then moving the probe 1 downward gradually by the first actuating mechanism 3 until the displacement of the probe 1 caused by the contact of the probe 1 with the circuit under examination X as shown in FIG. 8 is detected by the image processor 7. The first actuating mechanism 8 is stopped as soon as the point of contact is detected by the image processor 7. Then, at the same position, the circuit under examination X is lowered by the second actuating mechanism 5 for the desired gap with respect to the reference point provided by the detected point of contact.

Figure 9:
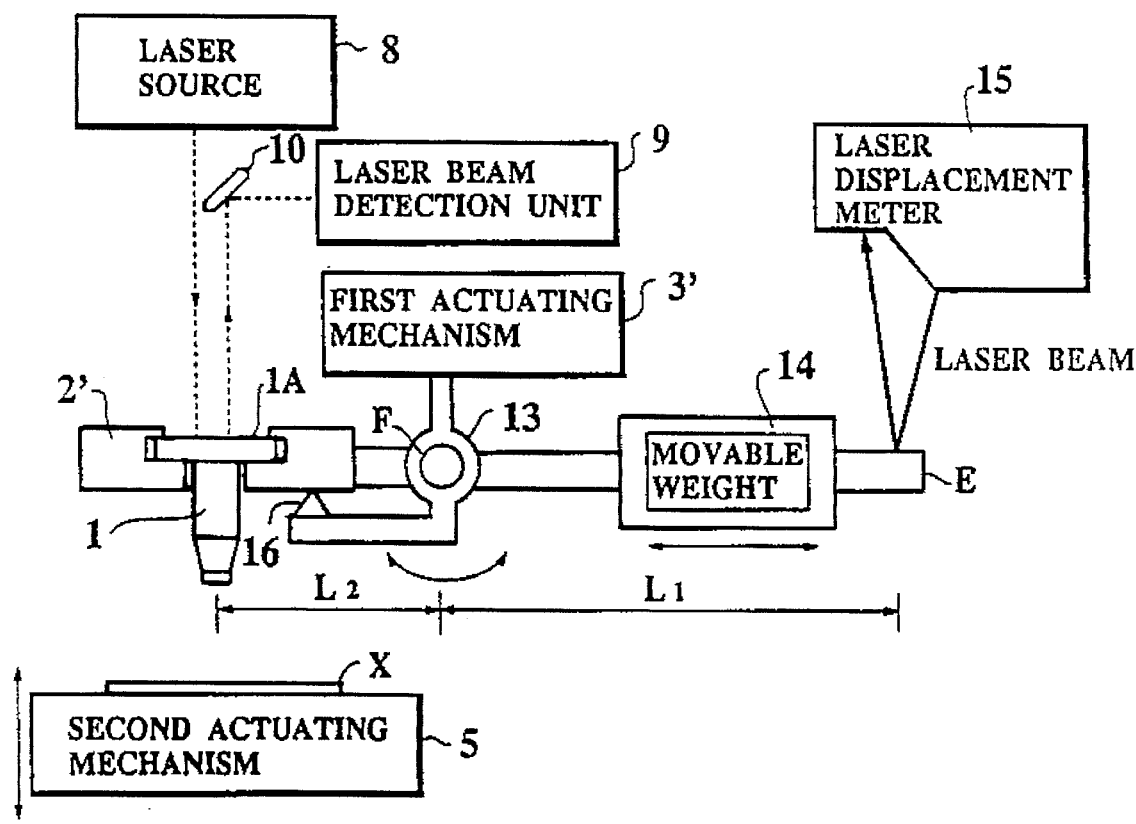
FIG. 9 is a block diagram of the second embodiment of an apparatus for electro-optic sampling measurement of the electric signals in integrated circuits according to the present invention.

Referring now to FIG. 9, the second embodiment of an apparatus for electro-optic sampling measurement of electrical signals in integrated circuits according to the present invention will be described in detail. This second embodiment is suitable for a case of using a relatively heavy weighted probe of a weight over few grams.

In this second embodiment, the apparatus comprises: the probe 1 for measuring the electric field in a circuit under examination X; the probe holder 2' for tightly holding the probe 1; a connection unit formed by a balance mechanism 13 equipped with a movable weight 14 as a counter weight for the probe 1 and a stopper 16 for limiting the downward movement of the probe holder 2'; the first actuating mechanism 3' for actuating the probe holder 2' in up and down direction at high precision by controlling the balance mechanism 13; the second actuating mechanism 5 for actuating the circuit under examination X placed thereon in up and down direction at high precision; the laser beam source 8 for providing incident laser beams to the electro-optic material of the probe 1; the laser beam detection unit 9 for detecting the reflected laser beams from the electro-optic material of the probe 1 through a mirror 10; and a contact detection unit formed by a laser displacement meter 15 for detecting the point of contact by detecting the displacement of a free end E of the balance mechanism 13 caused by the contact by using the laser beam illuminating the free end E of the balance mechanism 13.

As can be seen in FIG. 9, in this second embodiment, the probe holder 2' supports the probe 1 at the flange portion 1A tightly, but at the same time the probe holder 2' is attached to the balance mechanism 13 on opposite side of the movable weight 14 with respect to the fulcrum F, such that the movable weight 14 functions as the counter weight for the probe 1 which reduces the effective weight of the probe 1.

This configuration shown in FIG., 9 which uses the balance mechanism 13 has the following advantages.

(1) The effective weight of the probe 1 can be reduced to a desired level by adjusting the position of the movable weight 14 on the balance mechanism 13, so that a damage due to the contact of the probe 1 with the circuit under examination X can effectively be eliminated by reducing the effective weight of the probe 1 sufficiently even when a relatively heavy weighted probe of a weight over few grams is used.

(2) The detection of the contact can be carried out at high precision because the displacement of the free end E of the balance mechanism 13 due to the rotation of the probe 1 around the fulcrum F is caused by even a slight contact of the probe 1 with the circuit under examination X.

(3) The precision in the detection of the point of contact can be improved by making a length $L_1$ between the fulcrum F and the free end E to be substantially longer than a length $L_2$ between the fulcrum F and the probe 1 such that the small displacement of the probe 1 due to the shock caused by the slight contact can be amplified at the free end E of the balance mechanism 13.

Now, the method of electro-optic sampling measurement according to the present invention using the apparatus of FIG. 9 will be described in detail.

In the first stage of the procedure, in a state A shown in FIG. 4 in which the probe 1 is located over the conductor connected to the input and output terminal or power supply terminal of the circuit under examination, the measurement of the change of the beam intensity is carried out by applying the low frequency signals to the terminal, as follows.

Figure 10:
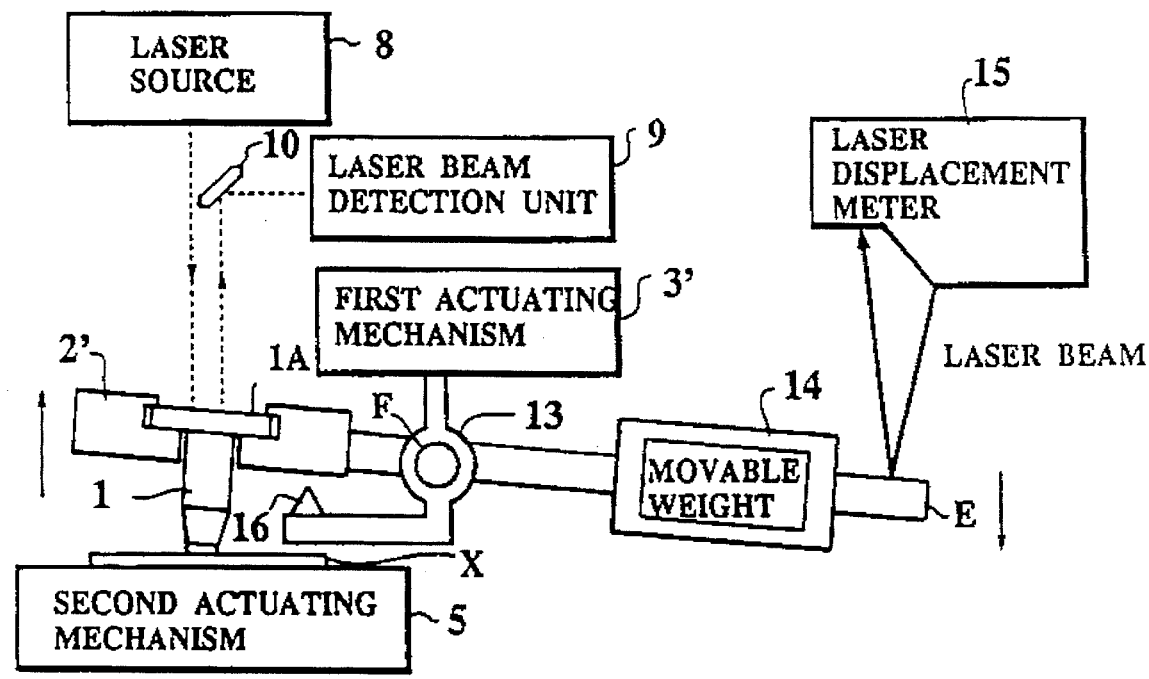
FIG. 10 is a block diagram of the apparatus for electro-optic sampling measurement shown in FIG. 9, in a state in which the probe makes a contact with the circuit under examination.

First, the probe 1 is brought into contact with the conductor connected to the input and output terminal or power source terminal of the circuit under examination X by placing and maintaining the probe 1 by the first actuating mechanism 3' over the conductor on which the measurement is to be made, and then moving the circuit under examination X upward gradually by the second actuating mechanism 5 until the displacement of the free end E of the balance mechanism 13 caused by the contact of the probe 1 with the circuit under examination X as shown in FIG. 10 is detected by the laser displacement meter 15. The second actuating mechanism 5 is stopped as soon as the point of contact is detected by the laser displacement meter 15.

Then, without operating the circuit under examination X, the known low frequency signal of the reference voltage level $V_0$ is externally applied to the terminal to which the conductor in contact with the probe 1 is connected, while the laser beams illuminate the probe 1, so as to measure the change of the beam intensity $\Delta I_0$ corresponding to the reference voltage level $V_0$, as Indicated by a state A shown in FIG. 5.

Next, at the same position, the circuit under examination X is sequentially lowered by the second actuating mechanism 5 to provide the predetermined gaps $h_1$ and $h_2$ with respect to the reference point provided by the detected point of contact, and the changes of the beam intensity $\Delta I_1$ and $\Delta I_2$ corresponding to the reference voltage level $V_0$ are measured for the gaps $h_1$ and $h_2$, respectively, as indicated by states B and C shown in FIG. 5, respectively.

Then, the quadratic function fitting for the relationship between the measured changes of beam intensity and the gap is obtained.

In the second stage of the procedure, in a state B shown in FIG. 4 In which the probe 1 is located over a desired measurement position on the circuit portion of the circuit under examination X, the measurement of the change of the beam intensity is carried out for the circuit under examination X In a normal operation state with high frequency signals, as follows.

First, the appropriate gap $h_m$ to be provided between the probe 1 and the circuit under examination X in the high frequency signal measurement is determined according to the conditions such as sensitivity, invasiveness, and thermal effect.

Then, by using the quadratic function fitting of FIG. 7 obtained from the low frequency signal measurement, the change of the beam intensity $\Delta I_3$ corresponding to the reference voltage level $V_0$ for the gap of $h_m$ is derived.

Next, the relationship between the change of the beam intensity $\Delta I$ and the voltage level V for the prescribed gap $h_m$ is obtained in a form of a straight line shown In FIG. 8 on a basis of the derived change of the beam intensity $\Delta I_3$ corresponding to the reference voltage level $V_0$.

Then, the following high frequency signal measurement at a desired measurement point is carried out.

First, the probe 1 is brought into contact with the circuit under examination X at the desired measurement point by placing and maintaining the probe 1 by the first actuating mechanism 3' over the desired measurement point on the circuit under examination X, and then moving the circuit under examination X upward gradually by the second actuating mechanism 5 until the displacement of the free end E of the balance mechanism 13 caused by the contact of the probe 1 with the circuit under examination X as shown in FIG. 10 is detected by the laser displacement meter 15. The second actuating mechanism 5 is stopped as soon as the point of contact is detected by the laser displacement meter 15.

Then, at the same position, the circuit under examination X is lowered by the second actuating mechanism 5 for the prescribed gap $h_m$ with respect to the reference point provided by the detected point of contact, and the changes of the beam intensity $\Delta I_m$ is measured for the prescribed gap h., as indicated by a state D shown in FIG. 5, respectively.

Finally, the absolute voltage corresponding to the measured change of the beam intensity $\Delta I_m$ is determined according to the relationship of FIG. 8.

Thus, according to this second embodiment, just as in the first embodiment described above, it becomes possible to measure the absolute voltage at arbitrary measurement point on the circuit under examination with good reproducibility, without adverse effects due to the invasiveness and heat generation. As a result, it becomes possible to obtain the information on the waveform amplitude which is necessary in carrying out the waveform comparison, especially in the analog circuit.

It is to be noted that in the procedure for the electro-optic sampling measurement described above, the positioning of the probe 1 to Provide the appropriate gap between the probe 1 and the circuit under examination X by moving the circuit under examination X by the second actuating mechanism 5 while fixing the probe 1 by the first actuating mechanism 3' may be replaced by any one of the following alternative procedures.

(1) The probe 1 can be brought into contact with the circuit under examination X by placing and maintaining the circuit under examination X by the second actuating mechanism 5 below the probe 1, and then moving the probe 1 downward gradually by the first actuating mechanism 3' until the displacement of the free end E of the balance mechanism 13 caused by the contact of the probe 1 with the circuit under examination X as shown in FIG. 10 is detected by the laser displacement meter 15. The first actuating mechanism 3' is stopped as soon as the point of contact is detected by the laser displacement meter 15. Then, at the same position, the probe 1 is raised by the first actuating mechanism 3' for the desired gap with respect to the reference point provided by the detected point of contact.

(2) The probe 1 can be brought into contact with the circuit under examination X by placing and maintaining the probe 1 by the first actuating mechanism 3' over the circuit under examination X, and then moving the circuit under examination X upward gradually by the second actuating mechanism 5 until the displacement of the free end E of the balance mechanism 13 caused by the contact of the probe 1 with the circuit under examination X as shown in FIG. 10 is detected by the laser displacement meter 15. The second actuating mechanism 5 is stopped as soon as the point of contact is detected by the laser displacement meter 15. Then, at the same position, the probe 1 is raised by the first actuating mechanism 3' for the desired gap with respect to the reference point provided by the detected point of contact.

(3) The probe 1 can be brought into contact with the circuit under examination X by placing and maintaining the circuit under examination X by the second actuating mechanism 5 below the probe 1, and then moving the probe 1 downward gradually by the first actuating mechanism 3' until the displacement of the free end E of the balance mechanism 13 caused by the contact of the probe 1 with the circuit under examination X as shown in FIG. 10 is detected by the laser displacement meter 15. The first actuating mechanism 3' is stopped as soon as the point of contact is detected by the laser displacement meter 15. Then, at the same position, the circuit under examination X is lowered by the second actuating mechanism 5 for the desired gap with respect to the reference point provided by the detected point of contact.

Referring now to FIG. 11 to FIG. 14, various other embodiments of the first actuating mechanism, connection unit, and contact detection unit other than those used in the above described embodiments will be described.

Figure 11:
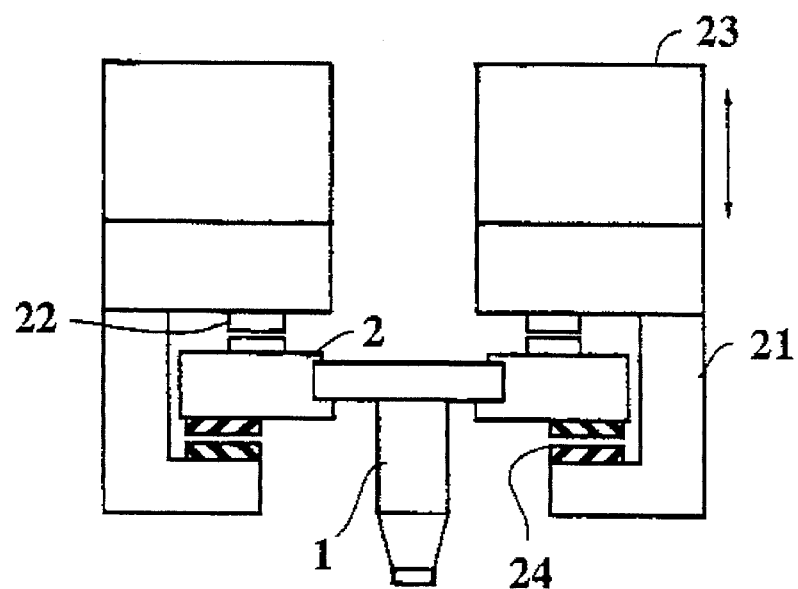
FIG. 11 is a schematic illustration of one of the other possible configurations around the probe holder in the apparatus according to the present invention.
Figure 12:
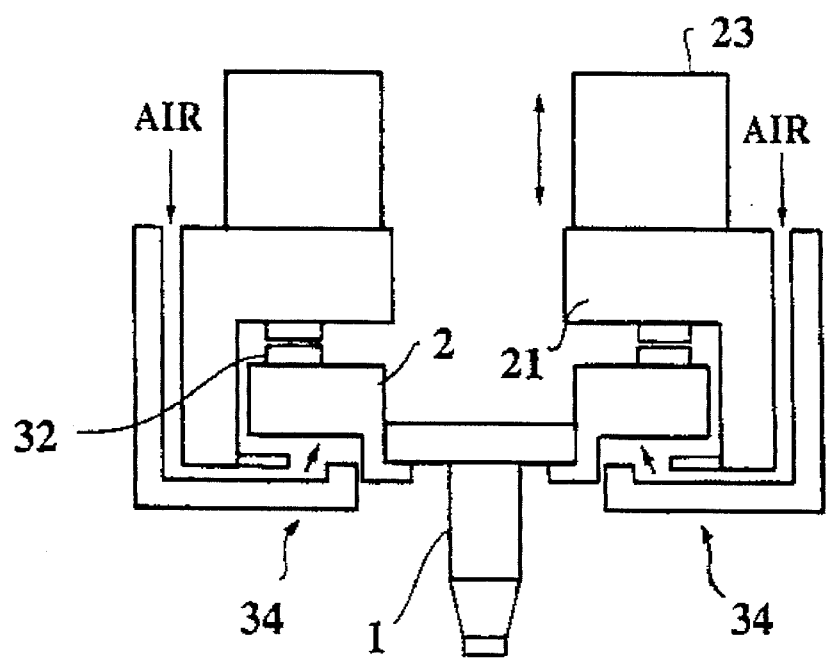
FIG. 12 is a schematic illustration of another one of the other possible configurations around the probe holder in the apparatus according to the present invention.
Figure 13:
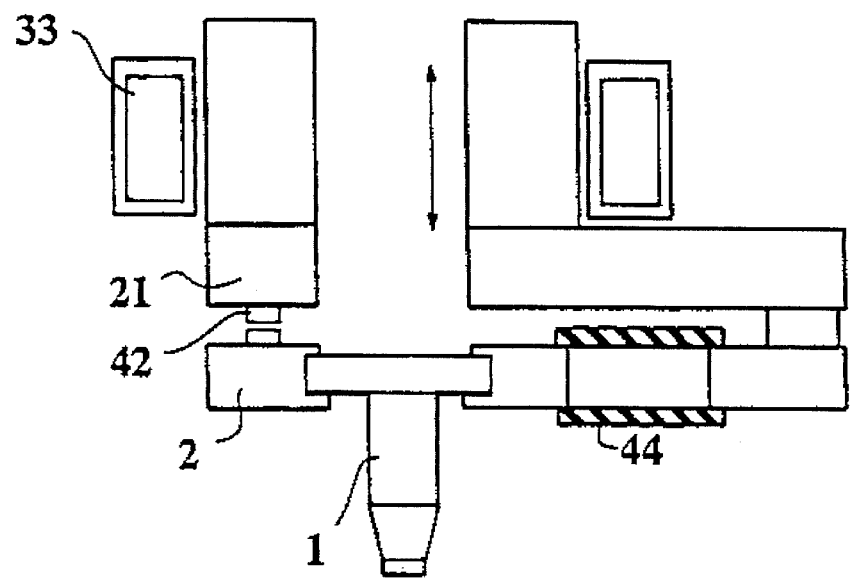
FIG. 13 is a schematic illustration of another one of the other possible configurations around the probe holder in the apparatus according to the present invention.

In the configuration of FIG. 11, the first actuating mechanism for moving the probe 1 is realized in a form of piezo-actuators 23 mounted on a frame 21 by which the probe holder 2 is supported, the connection unit is realized in a form of pairs of magnets 24 provided between the probe holder 2 and the frame 21 such that the repulsive force exerted between the mutually facing pieces of the magnets 24 functions to reduce the effective weight of the probe 1, and the contact detection unit is realized in a form of an eddy current displacement sensor 22 provided between the probe holder 2 and the frame 21 such that the displacement of the probe holder 2 due to the contact can be detected as the change in the eddy current generated in the eddy current displacement sensor In the configuration of FIG. 12, the first actuating mechanism for moving the probe 1 is realized in a form of piezo-actuators 23 mounted on a frame 21 by which the probe holder 2 is supported, the connection unit is realized in a form of an air pressure mechanism 34 provided between the probe holder 2 and the frame 21 such that the lifting force due to the pressurized air injected toward the probe holder 2 in an upward direction functions to reduce the effective weight of the probe 1, and the contact detection unit is realized in a form of a capacitance displacement sensor provided between the probe holder 2 and the frame 21 such that the displacement of the probe holder 2 due to the contact can be detected as the change in the capacitance produced in the capacitance displacement sensor In the configuration of FIG. 13, the first actuating mechanism for moving the probe 1 is realized in a form of electromagnetic coils 33 mounted on a frame 21 by which the probe holder 2 is supported, the connection unit is realized in a form of leaf springs 44 for supporting the probe holder 2 such that they function to reduce the effective weight of the probe 1, and the contact detection unit is realized in a form of an electric contact sensor 42 provided between the probe holder 2 and the frame 21 such that the displacement of the probe holder 2 due to the contact can be detected as a presence of the electricity conduction through the electric contact sensor 42 caused by the contact of the mutually facing pieces of the electric contact sensor 42 due to the displacement of the probe holder 2.

Figure 14:
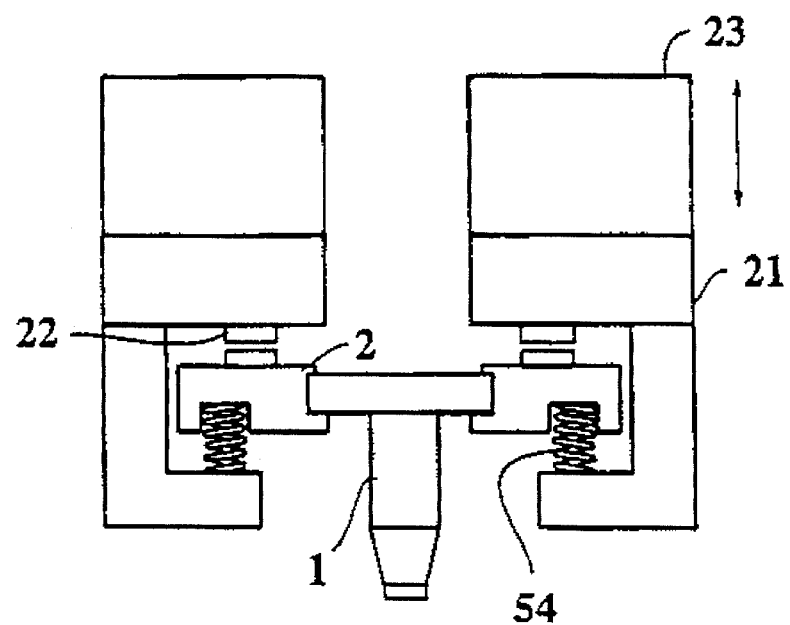
FIG. 14 is a schematic illustration of another one of the other possible configurations around the probe holder in the apparatus according to the present invention.

In the configuration of FIG. 14, the first actuating mechanism for moving the probe 1 is realized in a form of piezo-actuators 23 mounted on a frame 21 by which the probe holder 2 is supported, the connection unit is realized in a form of coil springs 54 provided between the probe holder and the frame 21 such that the spring force exerted by the coil springs 54 onto the probe holder 2 functions to reduce the effective weight of the probe 1, and the contact detection unit is realized in a form of an eddy current displacement sensor 22 provided between the probe holder 2 and the frame 21 such that the displacement of the probe holder 2 due to the contact can be detected as the change in the eddy current generated in the eddy current displacement sensor 22.

It is to be noted that, in the embodiments described above, the measurement of the absolute voltage should not be confused with the determination of the universal standard voltage level. The measurement of the absolute voltage in the above description only implies the determination of the voltage level with respect to a reference voltage scale, such that it becomes possible to calibrate the voltage amplitude of the waveform accurately.

It is also to be noted that although not included in the embodiments described above, in order to position the probe 1 at any desired measurement point on the circuit under examination, it is also necessary to provide mechanisms for moving the probe 1 or the circuit under examination X on a horizontal plane.

It is also to be noted that it is possible to provide a control circuit for controlling various elements of the apparatus according to the present invention to carry out the procedure described above automatically.

Besides those, many modifications and variations of the above embodiments may be made without departing from the novel and advantageous features of the present invention. Accordingly, all such modifications and variations are intended to be included within the scope of the appended claims.

What is claimed is:

1. An apparatus for electro-optic sampling measurement of electrical signals in an integrated circuit, comprising:

an electro-optic probe including an electro-optic material;

actuator means for moving the electro-optic probe and the integrated circuit relative to each other;

laser source means for providing incident laser beams to the electro-optic probe;

laser beam detection means for measuring a change of beam intensity of a laser beam injected into the electro-optic probe from the laser source means and reflected from the electro-optic probe when the electro-optic probe is placed inside an electric field produced by the integrated circuit;

contact detection means for detecting a contact position at which the electro-optic probe makes a contact with the integrated circuit; and means for reducing damage on the electro-optic probe and the integrated circuit due to a shock caused as the electro-optic probe makes contact with the integrated circuit.

2. The apparatus of claim 1, wherein the electro-optic material of the electro-optic probe has a sensitivity for only a longitudinal electric field.

3. The apparatus of claim 1, wherein the means for reducing the damage comprises probe holder means for supporting the electro-optic probe with respect to the integrated circuit loosely such that the electro-optic probe can freely be moved upwards when the electro-optic probe receives an upward force by making a contact with the integrated circuit located below the electro-optic probe.

4. The apparatus of claim 1, wherein the means for reducing the damage comprises means for reducing an effective weight of the electro-optic probe.

5. The apparatus of claim 4, wherein the means for reducing the effective weight of the electro-optic probe comprises a balance mechanism with probe holder means for supporting the electro-optic probe with respect to the integrated circuit which is attached to one end of the balance mechanism.

6. The apparatus of claim 5, wherein the balance mechanism includes a movable weight to function as a counter weight for the electro-optic probe.

7. The apparatus of claim 4, wherein the means for reducing the effective weight of the electro-optic probe comprises a pair of magnets in which a repulsive force exerted between the magnets functions to reduce the effective weight of the electro-optic probe.

8. The apparatus of claim 4, wherein the means for reducing the effective weight of the electro-optic probe comprises an air pressure mechanism in which a lifting force due to a pressurized air injected toward the probe holder means functions to reduce the effective weight of the electro-optic probe.

9. The apparatus of claim 4, wherein the means for reducing the effective weight of the electro-optic probe comprises leaf springs for supporting the probe holder means.

10. The apparatus of claim 1, wherein the actuator means comprises piezo-actuators.

11. The apparatus of claim 1, wherein the actuator means comprises electromagnetic coils.

12. The apparatus of claim 1, wherein the contact detection means comprises an image processor for detecting a displacement of the electro-optic probe caused by the contact according to images of the electro-optic probe.

13. The apparatus of claim 1, wherein the contact detection means comprises a laser displacement meter for detecting a displacement of the electro-optic probe caused by the contact according to a laser beam reflection.

14. The apparatus of claim 1, wherein the contact detection means comprises an eddy current displacement sensor for detecting a displacement of the electro-optic probe caused by the contact according to a change of eddy current.

15. The apparatus of claim 1, wherein the contact detection means comprises a capacitance displacement sensor for detecting a displacement of the electro-optic probe caused by the contact according to a change of capacitance.

16. The apparatus of claim 1, wherein the contact detection means comprises an electric contact sensor for detecting a displacement of the electro-optic probe caused by the contact according to a presence of electricity conduction.

* * * * *